(12) United States Patent
Schulz-Harder

(10) Patent No.: US 8,584,924 B2
(45) Date of Patent: *Nov. 19, 2013

(54) METHOD FOR THE PRODUCTION OF A METAL-CERAMIC SUBSTRATE, PREFERABLY A COPPER CERAMIC SUBSTRATE

(75) Inventor: Jürgen Schulz-Harder, Lauf (DE)

(73) Assignee: Curamik Electronics GmbH, Eschenbach (DE)

( * ) Notice: Subject to any disclaimer, the term of this patent is extended or adjusted under 35 U.S.C. 154(b) by 1551 days.

This patent is subject to a terminal disclaimer.

(21) Appl. No.: 10/506,611

(22) PCT Filed: Mar. 6, 2003

(86) PCT No.: PCT/DE03/00708
§ 371 (c)(1), (2), (4) Date: Jul. 6, 2005

(87) PCT Pub. No.: WO03/078353
PCT Pub. Date: Sep. 25, 2003

(65) Prior Publication Data
US 2006/0022020 A1   Feb. 2, 2006

(30) Foreign Application Priority Data

Mar. 13, 2002 (DE) .................................. 102 11 266
Mar. 21, 2002 (DE) .................................. 102 12 495

(51) Int. Cl.
*B23K 20/24* (2006.01)

(52) U.S. Cl.
USPC ............ 228/195; 228/193; 228/202; 228/215

(58) Field of Classification Search
USPC ........... 228/122.1, 123.1, 193, 194, 201, 202, 228/215, 159, 199; 216/13, 17, 41, 49, 33, 216/36, 83, 96, 100, 105; 29/846, 847
See application file for complete search history.

(56) References Cited

U.S. PATENT DOCUMENTS

| | | | | |
|---|---|---|---|---|
| 3,268,653 | A | * | 8/1966 | McNutt .......................... 174/262 |
| 3,429,029 | A | * | 2/1969 | Langdon et. al. ............. 438/614 |
| 4,622,058 | A | * | 11/1986 | Leary-Renick et al. ........ 65/105 |
| 4,775,786 | A | * | 10/1988 | Yamano et al. ................ 235/490 |
| 4,810,333 | A | * | 3/1989 | Gulla et al. .................... 205/125 |
| 5,676,855 | A | * | 10/1997 | Schulz-Harder ................ 216/52 |
| 5,756,377 | A | * | 5/1998 | Ohsawa ......................... 438/111 |
| 5,981,036 | A | | 11/1999 | Schulz-Harder |
| 6,054,762 | A | * | 4/2000 | Sakuraba et al. ............. 257/703 |
| 6,290,388 | B1 | * | 9/2001 | Saul et al. ....................... 374/44 |
| 6,627,384 | B1 | * | 9/2003 | Kim et al. ................... 430/280.1 |

* cited by examiner

*Primary Examiner* — Maria Veronica Ewald
*Assistant Examiner* — Megha Mehta
(74) *Attorney, Agent, or Firm* — Welsh Flaxman & Gitler LLC

(57) ABSTRACT

The invention relates to a novel process for producing a metal ceramic substrate, especially a copper-ceramic substrate, in which at least one metal foil at a time is applied to the surface sides of a ceramic layer or a ceramic substrate using a high temperature bonding process and the metal foil is structured on at least one surface side for forming conductive tracks, contact surfaces, and the like.

17 Claims, 5 Drawing Sheets

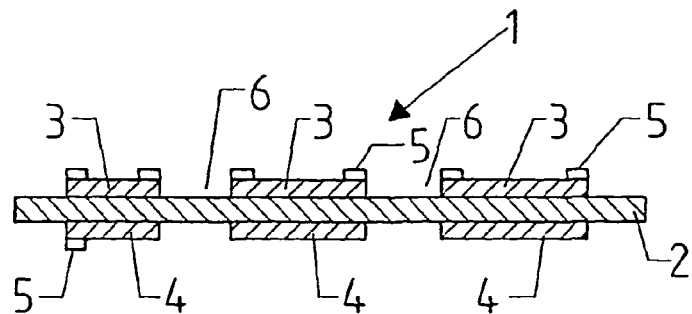
FIG.1
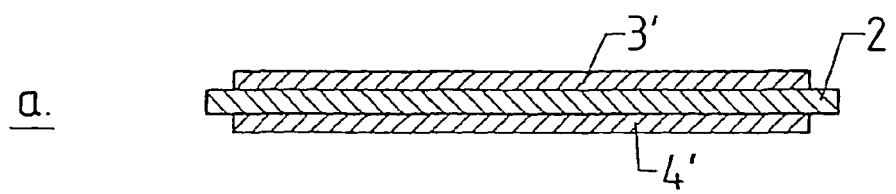
a.
FIG.2
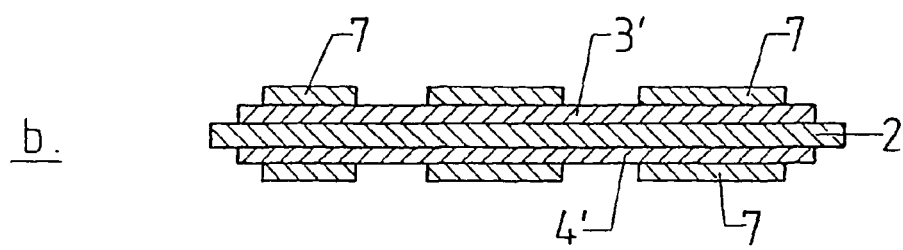
b.
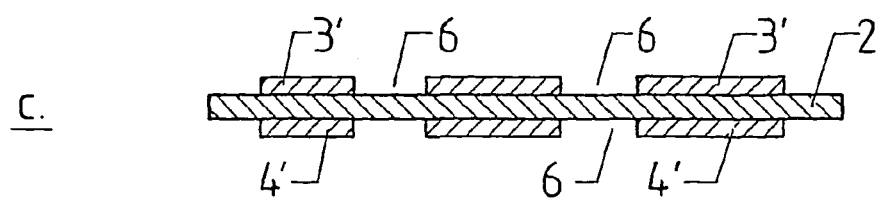
c.
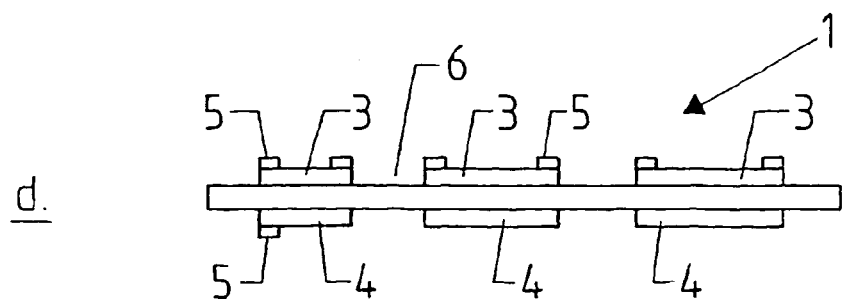
d.

METHOD FOR THE PRODUCTION OF A METAL-CERAMIC SUBSTRATE, PREFERABLY A COPPER CERAMIC SUBSTRATE

BACKGROUND OF THE INVENTION

The production of metal-ceramic substrates and especially copper-ceramic substrates for electrical wiring and circuits is known in the most varied versions. Producing the metal coating which is required for producing conductive tracks, terminals, etc. on a ceramic, for example on an aluminum oxide ceramic, using so-called "DCB process" (direct copper bond technology) is also especially known here, using metal or copper foils, or metal or copper sheets, which form the metal coating and which on their surface sides have a layer or a coating (melted-on layer) of a chemical compound of a metal and a reactive gas, preferably oxygen. In this process, which is described for example in U.S. Pat. No. 3,744,120, or DE-PS 23 19 854, this layer or this coating (melted-on layer) forms a eutectic with a melting point below the melting point of the metal (for example, copper) so that by placing the foil on the ceramic, and by heating all the layers, they can be joined to one another by melting on the metal, or copper, essentially only in the area of the melted-on layer or oxide layer. This DCB process then has the following process steps:

- oxidization of a copper foil such that a uniform copper oxide layer results;
- placing the copper foil on the ceramic layer;
- heating the composite to a process temperature between roughly 1025 to 1083° C., for example to roughly 1071° C.; and
- cooling to room temperature.

After applying the metal foils, at least on the surface side of the ceramic layer, structuring of the metal foil there, for example copper foil (also DCB copper), takes place to form conductive tracks, contact surfaces, etc.

Furthermore, the so-called active brazing process (DE 22 13 115; EP-A-153 618) is known, especially for producing metal-ceramic substrates. In this process, at a temperature between roughly 800-1000° C., a bond is formed between a metal foil, for example, copper foil, and a ceramic substrate, for example aluminum nitride ceramic, using a brazing solder which in addition to the main components such as copper, silver and/or gold, also contains an active metal. This active metal, which is for example one element of the group Hf, Ti, Zr, Nb, Cr, produces a bond between the brazing solder and the ceramic by a chemical reaction, while the bond between the brazing solder and the metal is a metallic brazing bond.

The production of metal-ceramic substrates takes place in a multiple printed panel such that on a ceramic substrate with a large area several individual substrates are formed spaced apart from one another and each have conductive tracks, contact surfaces, etc. On scored lines, which are made in the ceramic substrate by means of a laser, this multiple printed panel can be divided later into individual substrates by breaking, for example, after assembly.

An object of the invention is to devise a process with which the production of metal-ceramic substrates with improved properties is easily possible.

SUMMARY OF THE INVENTION

A high temperature bonding process is a process with which at a temperature greater than 650° C. a bond between the respective metal foil and the ceramic substrate, or the ceramic layer, is produced. A high temperature bonding process is therefore the above described direct bonding process, and when using copper, the above described DCB process. A high temperature bonding process for the purposes of the invention is however also the above described active brazing process.

It has been found that surprisingly in metal coatings, which are applied with a high temperature bonding process to the ceramic substrate especially reliable adhesion of the brazing resist is achieved. According to a finding which underlies the invention, this can apparently be attributed to grain enlargement of the material structure of the metal coatings which (grain enlargement) occurs in the high temperature bonding process.

In the invention, the application of at least one coating to the brazing resist (brazing resist coating) takes place, for example, immediately after structuring of the pertinent metal coating, optionally, after intermediate cleaning. This prevents possible fouling of the metal surfaces which adversely affects the adherence of the brazing resist before application of at least one brazing resist coating. It has also been surprisingly found that for metal surfaces which are formed by the DCB copper, especially reliable adhesion of the brazing resist is achieved and migration of the brazing resist down during brazing is effectively prevented although the copper metal coating which has been applied by means of the DCB process has an increased proportion of oxygen.

In the process, it is possible for the brazing resist to be applied to the metal coating even before the structuring of the pertinent metal coating. If the conventional etching and masking technique is used for structuring of the metal coating, in which an etching resist is applied, for example, in the form of a photo resist, or silk screen resist, for the brazing resist, a resist is used which compared to conventional agents which are used for etching and/or removing the mask from the etching resist is especially resistant to the alkali solutions which are conventionally used here. An epoxy-resin based resist is especially suited here as the brazing resist.

It was assumed above that in the process the application of metal coatings to the ceramic substrate takes place using the direct bonding technique. Of course in the invention, other high temperature bonding processes, or techniques can be used, for example, the active brazing process.

If the metal-ceramic substrate is produced in a multiple printed panel, as is preferably the case, the brazing resist is applied before the scored lines are made in the ceramic substrate, therefore before oxidation and/or fouling of the metal surfaces which adversely affects adhesion of the brazing resist, for example by laser plasma when the scored lines are produced, could occur.

BRIEF DESCRIPTION OF THE DRAWINGS

The invention is detailed below using the figures on various embodiments.

FIG. 1 shows in a simplified representation and in a section a copper-ceramic substrate which has been produced using the process;

FIG. 2 shows in positions a-d the different process steps in one possible embodiment of the process for producing the substrate of FIG. 1;

DETAILED DESCRIPTION OF THE INVENTION

Figure 3:
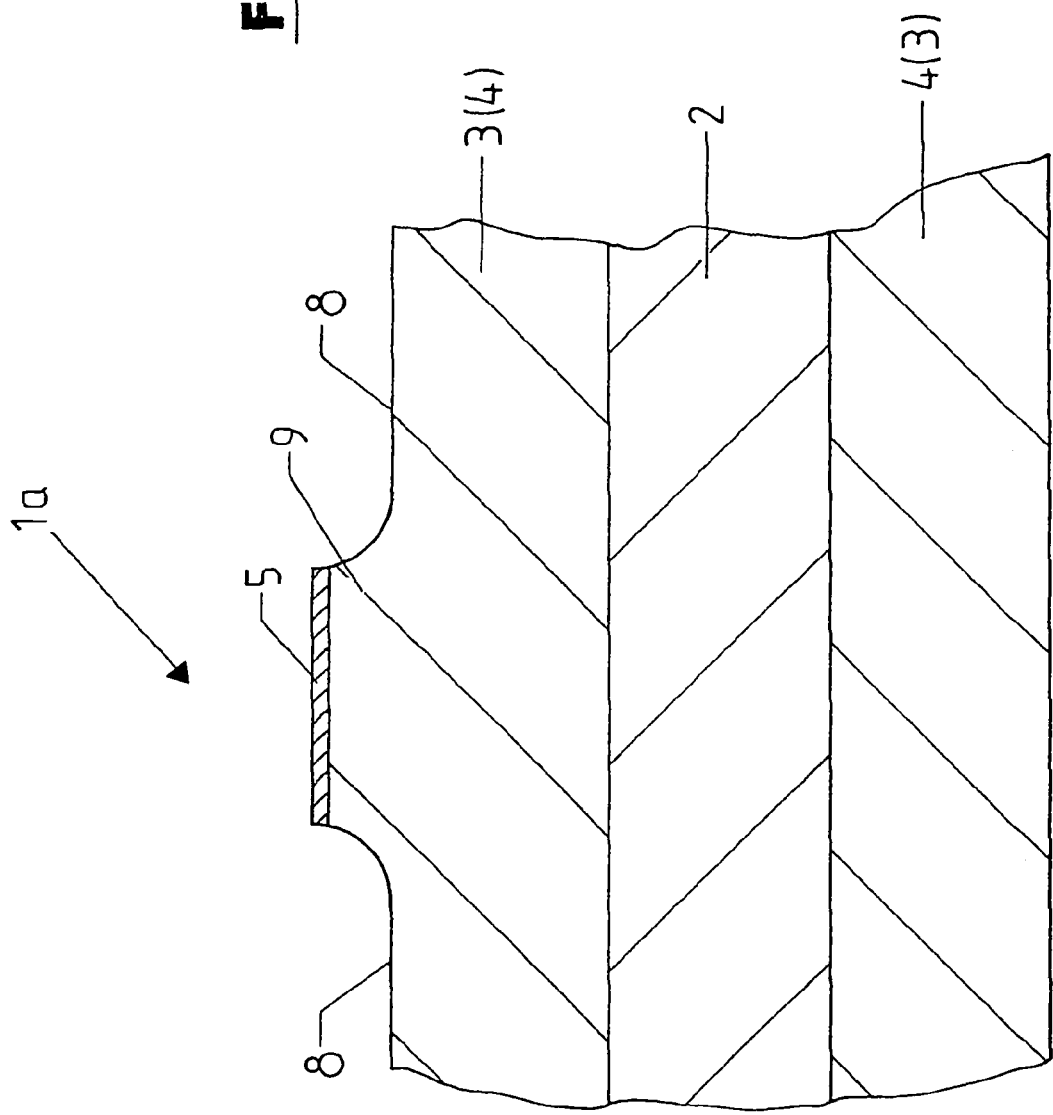
FIG. 3 shows in an enlargement a partial section through a substrate which has been produced using the process in the area of a brazing resist coating after removal of the metal of the bordering metal surface.
Figure 4:
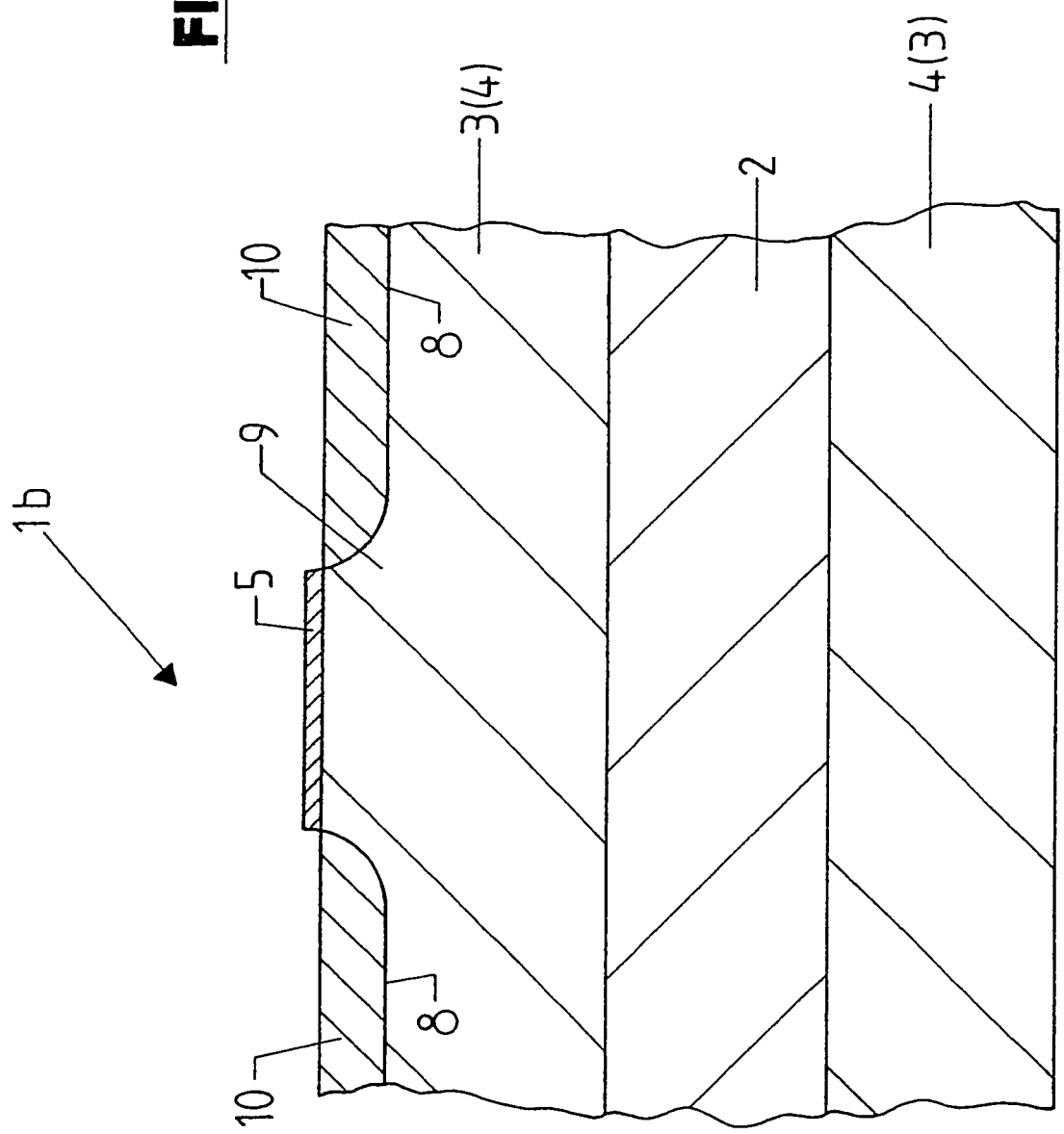
FIG. 4 shows a representation similar to FIG. 3, but with subsequent metal coating.

FIGS. 1 and 2 show a ceramic-copper substrate consisting of a ceramic layer 2 and metal coatings 3 and 4 which are provided on the two surface sides of the ceramic layer 3 and which are structured in the required manner to form conductive tracks, contact surfaces, etc., and consist of copper. In certain areas of the metal coatings 3 and 4, brazing enamel coatings 5 are applied which are made, for example, strip-shaped, but can also have a different shape and which in the assembly of the substrate 1 with components border that area of the metal coating 3 and 4, which is to be wetted by the brazing solder used. With the coatings 5 which extend for example along the edges of the contact surfaces and the conductive tracks produced by the structuring, the brazing compound used in assembly of the substrate 1 is prevented from flowing into the intermediate spaces 6 which are formed between the conductive paths, contacts, etc., and which electrically separate them and the resulting short circuits between the conductive tracks are prevented.

The substrate 1 is produced with the process steps shown in FIG. 2, i.e. first copper foils 3' and 4' are applied to the ceramic layer 2, using the DCB technique, so that these copper foils 3' and 4' are bonded on their entire surface to one surface side of the ceramic layer 2 at a time.

Subsequently, according to steps b) and c) of FIG. 2 the structuring of the copper foils 3' and 4' takes place for formation of the structured metal coatings 3 and 4, with the conventional etching and masking technique by application of a mask 7 of a photo resist or etching resist and subsequently etching away the areas of the copper foils 3' and 4' which are not covered by the mask 7 (position b) so that finally after removal of the mask 7 the intermediate product which is shown in position c is obtained, consisting of the ceramic layer 2 and the structured metal coatings 3 and 4. In a subsequent process step, the brazing resist coatings 5 are produced, for example, by a screen printing process so that finally the substrate 1 which is shown again in position d is obtained.

The brazing resist coatings 5 are done with a thickness such that these coatings 5 have a thickness between 0.5 to 100 microns after curing of the brazing resist. For example, an epoxide-based resist is used as the brazing resist. The brazing resist is cured by heating.

It has been found that when the brazing resist is applied immediately after the DCB process, or immediately after completion of structuring of the copper foils 3' or 4' by the etching and masking technique optimum adhesion of the brazing resist to the copper foils is achieved and especially the brazing resist coating is effectively prevented from migrating down through the brazing solder during later assembly of the substrate 1 without the fundamental necessity of cleaning the metal surfaces before application of the brazing resist.

In the described process however, it is also possible to additionally clean the surfaces of the metal coatings 3 and 4 after structuring. For this additional cleaning or intermediate cleaning the most varied cleaning processes are conceivable, for example, by removing a surface area of the coatings 3 and 4. Especially for this purpose can be used a chemical process be used by employing an acid hydrogen peroxide solution or an acid sodium persulfate solution. Furthermore, intermediate cleaning of the surfaces of the metal coatings 3 and 4 by plasma etching and/or electrochemical or electrolytic etching (galvanic removal of copper) is possible. Moreover, purely mechanical cleaning processes, for example by brushing, grinding or the like, can be used.

FIG. 3 shows, in an enlargement, a partial section through a copper-ceramic substrate 1a in which the metal coatings 3 and 4 at least in surface areas which border the brazing resist coating 5 are removed, by a chemical etching process, as far as the surface 8. The brazing resist coating 5 is used here as masking during etching. The etchant can also be agents which dissolve copper, for example acid hydrogen peroxide, acid sodium persulfate, copper chloride, iron chloride, etc. Removal takes place, for example, with a thickness from 0.1 to 20 microns so that the brazing resist coating 5 is then located on a projection 9 which projects over the surface 8 which has been produced by removal. This execution can greatly improve the action of the brazing resist coating 5.

Figure 5:
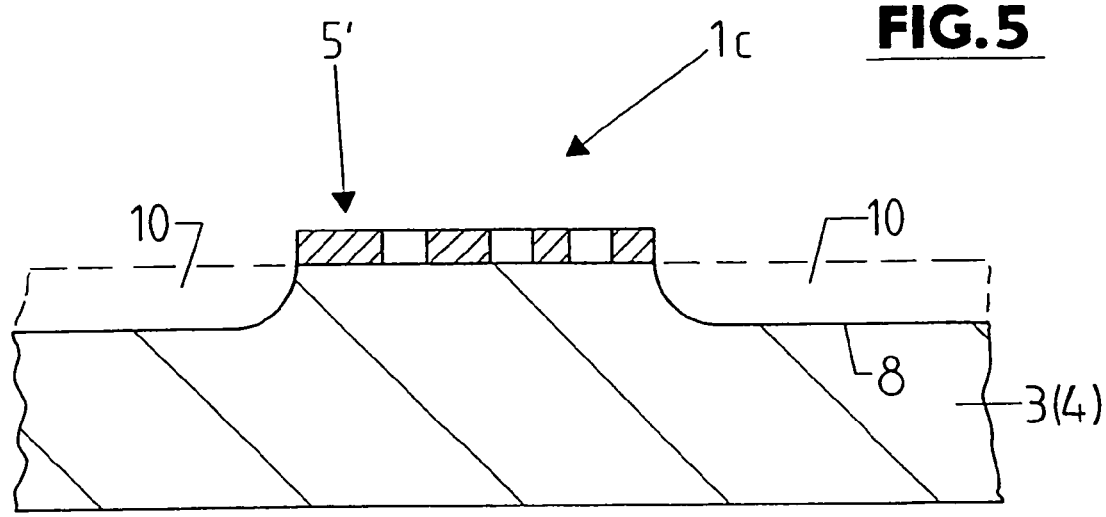
FIG. 5 shows a representation similar to FIG. 3, but with a structured brazing resist coating.

Furthermore, according to FIG. 5, there is the possibility of applying to the abraded surface areas 8 an additional surface metal coating 10 which then lies with its surface side lower or in one plane with the original surface of the metal coating 3 and 4 which has not been removed, under the brazing resist coating 5. The metal coating 10 forms a corrosion-resistant metal surface or in general a surface which greatly improves further processing of this substrate 1b. The metal for the additional metal coating 10 is nickel or phosphorus nickel. The application of the additional metal coating 10 takes place without current by chemical precipitation.

It is also possible to form the metal coating 10 in several layers, for example consisting of a lower first layer which directly borders the surface 8, for example, of nickel, and an external layer of gold or tin.

Figure 6:
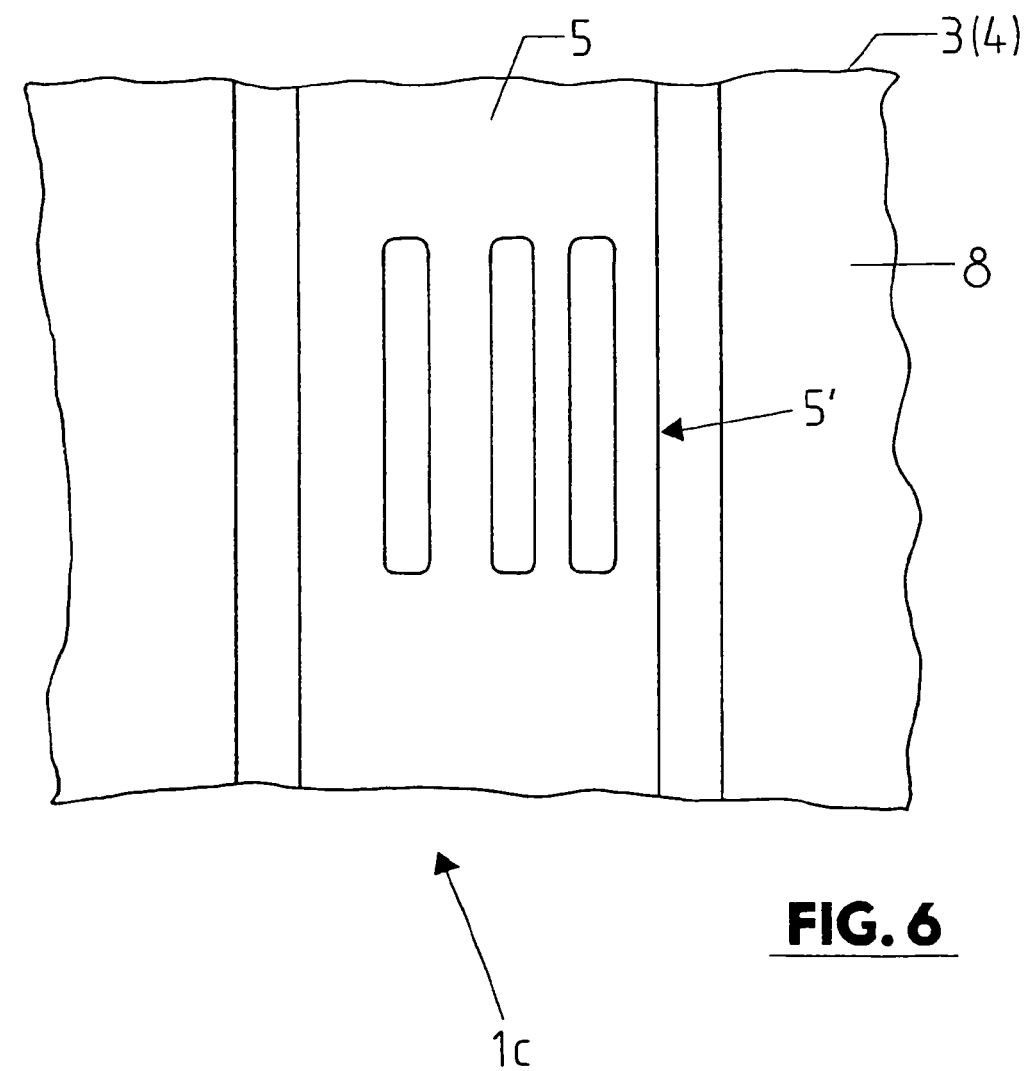
FIG. 6 shows an overhead view of the structured brazing resist coating.

FIGS. 5 and 6 show as another possible embodiment a substrate 1c in which at least one brazing resist coating 5 in a component area 5' is worked with a suitable technique such that on the surface of the substrate in this area 5' an optically visible structure in the form of a bar code or data matrix code results. This code which is readable with a camera system then contains various data which relate to the respective substrate, for example the article number, but also other data which are necessary for monitoring and/or control of production, such as the production date, batch number, etc.

The structuring of the area 5' takes place by means of a laser by burning the structure or the code into the brazing resist coating 5 or by partially burning away the coating 5 for the structure.

Preferably the substrates 1-1c are produced in a multiple printed panel, i.e. a correspondingly large ceramic substrate is first provided on the two surface sides in the above described manner with copper foils 3' and 4' and they are then structured such that the structured metal coatings 3 and 4 form not only conductive tracks, contact surfaces, etc. of a single copper-ceramic substrate, but a plurality of these individual substrates on a common ceramic plate. After structuring and preferably also after application of the brazing resist coatings 5 then so-called "laser scribing" of the ceramic substrate takes place to form scored lines on which the multiple substrate can be broken into individual substrates after assembly with components. Scribing takes place with a laser (for example, a $CO_2$ or YAG laser). Then the laser which has been used for scribing can be used for structuring the area 5' or for applying the code.

Figure 7:
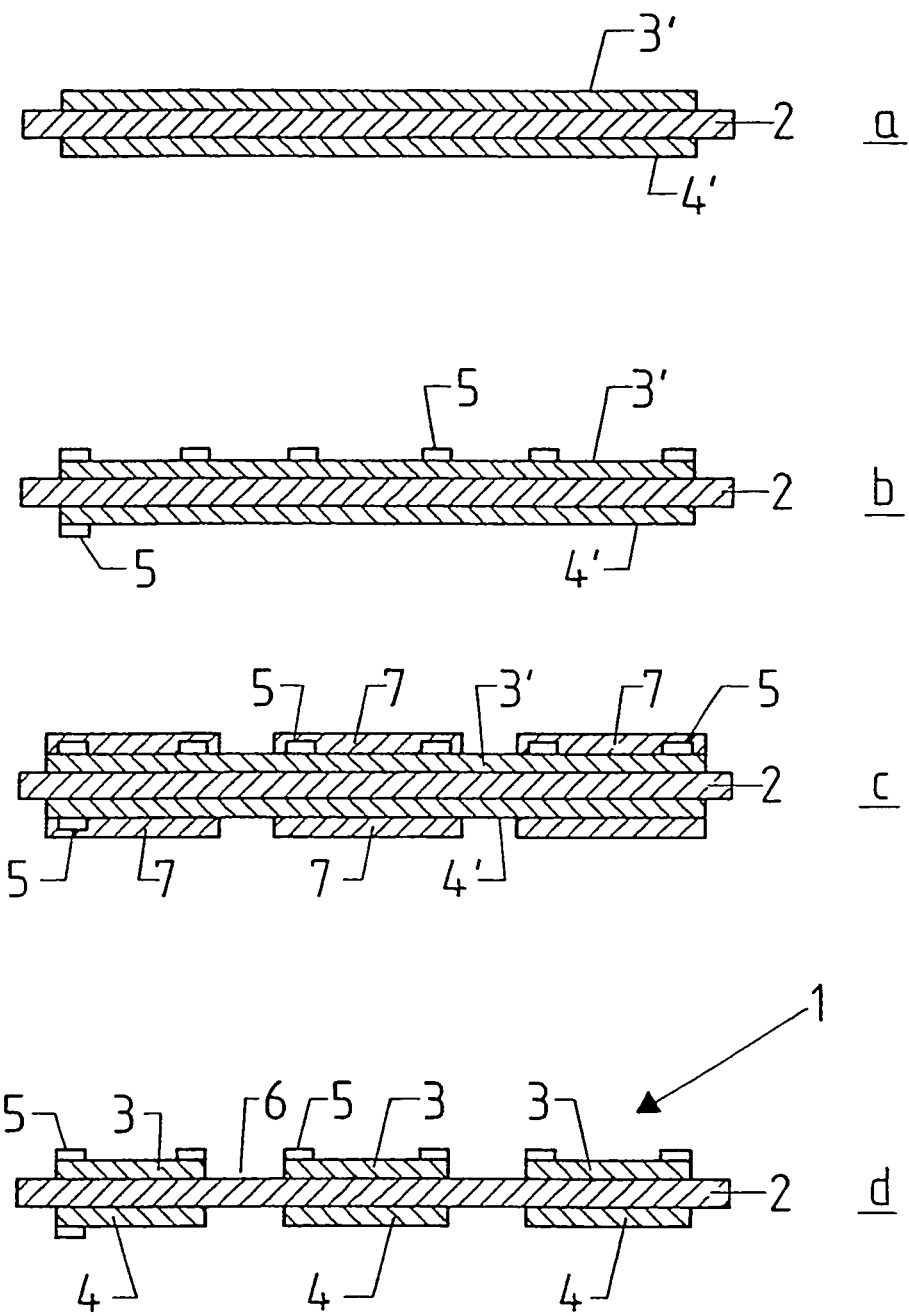
FIG. 7 shows a representation like FIG. 2 in another version of the process.

FIG. 7 shows in a representation similar to FIG. 2 the individual process steps for producing the ceramic-copper substrate 1 in a production process which has been modified compared to FIG. 2. According to the position a of FIG. 7 in turn one metal foil 3' or 4' at a time is applied to the ceramic layer 2 on both sides, for example using the DCB technique. Immediately after this process step and before structuring of the copper foils 3' and 4' the brazing resist coatings 5 (position b of FIG. 7) take place. In the subsequent process steps c and d then structuring of the copper foils 3' and 4' takes place for formation of the structured metal coatings 3 and 4 with the conventional etching and masking technique by application of the mask 7 from the etching resist, by structured application of the etching resist by a printing technique (for example, by screen printing) or by a photo technique using a photo resist and by subsequently etching away the areas of the copper foils 3' and 4' which were not covered by the mask 7 (position d) so that finally after removing or "stripping" the mask 7 a copper-ceramic substrate 1 is obtained with the brazing resist coatings 5 on the structured metal coatings 3 and 4. For the brazing resist coatings a resist is used which compared to the conventional materials used in the masking and etching technique is also resistant to the materials used for removing the mask 7 (alkali solutions). The brazing resist in this version of the process can be in turn epoxy resin-based resists.

It has been found that in this process especially reliable adhesion of the etching resist to the metal foils 3' and 4' and to the later structured metal coatings 3 and 4 is also attained; among others in turn this can be attributed to the grain enlargement of the copper in the DCB process.

The invention was described above on various versions. It goes without saying that numerous other changes and modifications are possible without in this way departing from the inventive idea underlying the invention.

It was assumed above that the bonding of the metal foils or copper foils to the ceramic layer 2 takes place using the DCB process. Basically also another high temperature bonding process can be used, for example the active brazing process, especially when the ceramic layer 2 consists for example of an aluminum nitride ceramic.

REFERENCE NUMBER LIST 1, 1a, 1b, 1c copper-ceramic substrate
2 ceramic layer
3, 4 structured metal coating
3', 4' copper foil
5 brazing resist coating
5' structured area
6 intermediate space
7 mask
8 metal or copper surface produced by removal
9 projection
10 additional surface metal coating

What is claimed is:

1. A process for producing a metal-ceramic substrate comprising a ceramic layer and a structured metal layer with conductive tracks and contact surfaces on at least one surface side of the ceramic layer and further comprising at least one brazing resist coating applied to the structured metal layer, the process comprising the following steps:
   a) applying at least one metal layer to at least one surface side of the ceramic layer by high temperature bonding at a bonding process temperature higher than 650° C. for forming at least one metal layer on the ceramic layer,
   b) after applying the at least one metal layer to the at least one surface side of the ceramic layer, structuring the at least one metal layer on at least one surface side of the ceramic layer for forming the structured metal layer with conductive tracks and contact surfaces,
   c) after structuring the at least one metal layer, applying the at least one brazing resist coating to the structured metal layer, the at least one brazing resist coating having a thickness of between 0.5 and 100 microns and being formed by an epoxy resin-based resist,
   d) after applying the at least one brazing resist coating to the structured metal layer, removing metal from the structured metal layer in an amount of 0.1-20 microns at least in surface areas bordering the brazing resist coating, and
   e) after applying the brazing resist coating, leaving the at least one brazing resist coating on the structured metal layer of the metal-ceramic substrate produced by the steps (a) to (d).

2. The process as claimed in claim 1, wherein high temperature bonding is a direct bonding process or an active brazing process.

3. The process as claimed in claim 1, wherein the at least one metal layer is at least one copper foil and the at least one copper foil is provided on the ceramic layer by a direct copper bonding process or an active brazing process.

4. The process as claimed in claim 1, wherein the structuring of the at least one metal layer takes place by a masking-etching process and wherein the at least one brazing resist coating is applied immediately after the structuring of the at least one metal layer.

5. The process as claimed in claim 1, wherein the structuring of the at least one metal layer takes place by a masking-etching process using an etching resist and wherein the at least one brazing resist coating is applied immediately before application of the etching resist.

6. The process as claimed in claim 1, wherein the removing metal from the structural metal layer takes place by etching, using hydrogen peroxide, sodium persulfate, copper chloride or iron chloride.

7. The process as claimed in claim 1, wherein before the application of at least one brazing resist coating, cleaning metal surfaces of the structured metal layer by removing a surface area of the structured metal layer takes place.

8. The process as claimed in claim 7, wherein cleaning takes place by chemical removal, by plasma etching, by electrical etching, galvanic removal, by mechanical working, by brushing or grinding.

9. The process as claimed in claim 8, wherein chemical removal takes place using a hydrogen peroxide solution or a sodium persulfate solution.

10. The process as claimed claim 1, wherein a surface metal coating is applied to at least one surface area of the at least one metal layer, which area is produced by removal and adjoins the at least one brazing resist coating.

11. The process as claimed in claim 10, wherein the surface metal coating is applied such that the surface which has been formed by this surface metal coating is lower than, level or roughly level with or projects over a surface of the at least one brazing resist coating or lower than, level or roughly level with or projects over an untreated surface underneath the at least one brazing resist coating.

12. The process as claimed in claim 1, wherein an epoxide-based coating is used for the brazing resist coating and wherein the brazing resist coating cures thermally.

13. The process as claimed in claim 1, wherein the at least one brazing resist coating is structured in an area for forming an optically readable code.

14. A process for producing a metal-ceramic substrate comprising a ceramic layer and a structured metal layer forming conductive tracks and contact surfaces on at least one surface side of the ceramic layer, and further comprising at least one brazing resist coating applied to the structured metal layer, the process comprising the following steps:
  a) applying at least one metal layer to at least one surface side of the ceramic layer by high temperature bonding at a bonding process temperature higher than 650° C. for forming at least one metal layer on the ceramic layer,
  b) after applying the at least one metal layer to the at least one surface side of the ceramic layer, structuring the at least one metal layer to form the structured metal layer on the at least one surface side of the ceramic layer by applying a mask of a photo resist or edging resist to a surface side of the at least one metal layer opposite to the ceramic layer and by subsequent edging away areas of the at least one metal layer which are not covered by the mask of the photo resist or edging resists for forming the metal layer with the conductive tracks and contact surfaces,
  c) after edging away areas of the at least one metal layer which are not covered by the mask of the photo resist or edging resists, removing the mask of photo resist or edging resists and applying the at least one brazing resist coating to the structured metal layer, the at least one brazing resist coating having a thickness between 0.5 and 100 microns and being formed by an epoxy resin-based resist,
  d) after applying the at least one brazing resist coating to the structured metal layer removing metal from the structured metal layer in an amount of 0.1-20 microns at least in surface areas of the structured metal layer bordering the at least one brazing resist coating on the at least one surface side opposite to the ceramic layer, and
  e) after applying the brazing resist coating, leaving the at least one brazing resist coating on the structured metal layer of the metal-ceramic substrate produced by the steps (a) to (d).

15. A process for producing a metal-ceramic substrate comprising a ceramic layer and a structured metal layer forming conductive tracks and contact surfaces on at least one surface side of the ceramic layer, and further comprising a brazing resist coating applied to the structured metal layer, the process comprising the following steps:
  a) applying at least one metal layer to at least one surface side of the ceramic layer by high temperature bonding at a bonding process temperature higher than 650° C. for forming at least one metal layer on the ceramic layer,
  b) after applying the at least one metal layer to the at least one surface side of the ceramic layer, structuring the at least one metal layer to form the structured metal layer on the at least one surface side of the ceramic layer by applying a mask of a photo resist or edging resist to a surface side of the at least one metal layer opposite to the ceramic layer and by subsequent edging away areas of the at least one metal layer which are not covered by the mask of the photo resist or edging resists for forming the structured metal layer with the conductive tracks and contact surfaces,
  c) after edging away areas of the at least one metal layer which are not covered by the mask of the photo resist or edging resists, removing the mask of photo resist or edging resists and then applying the brazing resist coating to the structured metal layer with a thickness of 0.5 to 100 microns, such that it extends in a strip like manner along edges of the contact tracks and contact surfaces and being formed by an epoxy resin-based resist,
  d) after applying the brazing resist coating to the structured metal layer removing metal from the structured metal layer in an amount of 0.1-20 microns at least in surface areas of the structured metal layer bordering the brazing resist coating on the at least one surface side opposite to the ceramic layer, and
  e) after applying the brazing resist coating leaving the brazing resist coating on the structured metal layer of the metal-ceramic substrate produced by the steps (a) to (d).

16. The process for producing a metal-ceramic substrate as claimed in claim 15 further comprising the step of:
  f) applying a surface metal coating to at least one surface area of the structured metal layer, the at least one surface area is produced by removing some metal from the structured metal layer and the at least one surface area adjoins the brazing resist coating.

17. The process for producing a metal-ceramic substrate as claimed in claim 16 further comprising the step of:
  g) applying a surface metal coating to at least one surface area of the structured metal layer, the area is produced by removing some metal from the structured metal layer and the at least one surface area adjoins the brazing resist coating.

* * * * *